(12) United States Patent
Kollipara et al.

(10) Patent No.: US 9,373,384 B2
(45) Date of Patent: Jun. 21, 2016

(54) INTEGRATED CIRCUIT DEVICE HAVING PROGRAMMABLE INPUT CAPACITANCE

(71) Applicant: Rambus Inc., Sunnyvale, CA (US)

(72) Inventors: Ravindranath Kollipara, Palo Alto, CA (US); Lei Luo, Durham, NC (US); Ian Shaeffer, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 486 days.

(21) Appl. No.: 13/845,503

(22) Filed: Mar. 18, 2013

(65) Prior Publication Data

US 2013/0258755 A1 Oct. 3, 2013

Related U.S. Application Data

(60) Provisional application No. 61/619,020, filed on Apr. 2, 2012.

(51) Int. Cl.
| | |
|---|---|
| *H03K 19/003* | (2006.01) |
| *G11C 11/401* | (2006.01) |
| *G11C 5/04* | (2006.01) |
| *G11C 7/10* | (2006.01) |

(52) U.S. Cl.
CPC ............. *G11C 11/401* (2013.01); *G11C 5/04* (2013.01); *G11C 7/1057* (2013.01); *G11C 7/1084* (2013.01)

(58) Field of Classification Search
CPC .......................... H03K 19/003; G11C 11/401
USPC .................. 326/21, 22, 30; 365/149
See application file for complete search history.

(56) References Cited

U.S. PATENT DOCUMENTS

| | | | | |
|---|---|---|---|---|
| 5,966,047 | A * | 10/1999 | Anderson et al. | ............. 327/565 |
| 2007/0139071 | A1 * | 6/2007 | Nguyen | ............. 326/30 |
| 2007/0260841 | A1 * | 11/2007 | Hampel et al. | ............. 711/167 |
| 2008/0094811 | A1 * | 4/2008 | Hazelzet | ............. G11C 5/04 |
| | | | | 361/760 |
| 2010/0162037 | A1 * | 6/2010 | Maule | ............. G06F 11/106 |
| | | | | 714/5.11 |

* cited by examiner

*Primary Examiner* — Daniel D Chang
(74) *Attorney, Agent, or Firm* — The Neudeck Law Firm, LLC (57) ABSTRACT

An embodiment is directed to an integrated circuit device having programmable input capacitance. For example, a programmable register of a memory device may store a value representative of an adjustment to the input capacitance value of a control pin. An embodiment is directed to controlling the skew of a synchronous memory system by allowing programmability of the lighter loaded pins in order to increase their load to match the more heavily loaded pins. By matching lighter loaded pins to more heavily loaded pins, the system exhibits improved synchronization of propagation delays of the control and address pins. In addition, an embodiment provides the ability to vary the loading depending on how many ranks are on the device.

26 Claims, 11 Drawing Sheets

On Die Termination (ODT) 610

| RD3 | RD2 | RD1 | RD0 | Ci Adjustment (ODT) |
|---|---|---|---|---|
| 0 | 0 | 0 | 0 | 1.0x |
| 0 | 0 | 0 | 1 | 1.2x |
| 0 | 0 | 1 | 0 | 1.4x |
| 0 | 0 | 1 | 1 | 1.6x |
| 0 | 1 | 0 | 0 | 1.8x |
| 0 | 1 | 0 | 1 | 2.0x |
| 0 | 1 | 1 | 0 | 2.2x |
| 0 | 1 | 1 | 1 | 2.4x |
| 1 | 0 | 0 | 0 | 2.6x |
| 1 | 0 | 0 | 1 | 2.8x |
| 1 | 0 | 1 | 0 | 3.0x |
| 1 | 0 | 1 | 1 | 3.2x |
| 1 | 1 | 0 | 0 | 3.4x |
| 1 | 1 | 0 | 1 | 3.6x |
| 1 | 1 | 1 | 0 | 3.8x |
| 1 | 1 | 1 | 1 | 4.0x |

Chip Select (CS) 620

| RD3 | RD2 | RD1 | RD0 | Ci Adjustment (CS) |
|---|---|---|---|---|
| 0 | 0 | 0 | 0 | 1.0x |
| 0 | 0 | 0 | 1 | 1.2x |
| 0 | 0 | 1 | 0 | 1.4x |
| 0 | 0 | 1 | 1 | 1.6x |
| 0 | 1 | 0 | 0 | 1.8x |
| 0 | 1 | 0 | 1 | 2.0x |
| 0 | 1 | 1 | 0 | 2.2x |
| 0 | 1 | 1 | 1 | 2.4x |
| 1 | 0 | 0 | 0 | 2.6x |
| 1 | 0 | 0 | 1 | 2.8x |
| 1 | 0 | 1 | 0 | 3.0x |
| 1 | 0 | 1 | 1 | 3.2x |
| 1 | 1 | 0 | 0 | 3.4x |
| 1 | 1 | 0 | 1 | 3.6x |
| 1 | 1 | 1 | 0 | 3.8x |
| 1 | 1 | 1 | 1 | 4.0x |

| Drops 1110 | Address delay 1114 | Control delay 1116 | Control delay 1118 |
|---|---|---|---|
| | ps | ps | ps |
| | | Load: 1*Ci | Load: 2*Ci |
| D1 to D2 | 166 | 130 | 130.3 |
| D2 to D3 | 184 | 158 | 188 |
| D3 to D4 | 181 | 156.6 | 172 |
| D4 to D5 | 372 | 340 | 357 |
| D5 to D6 | 178 | 140.4 | 168 |
| D6 to D7 | 178 | 152.6 | 169 |
| D7 to D8 | 180 | 151 | 169 |
| D8 to D9 | 186 | 149 | 171 |
| | | | |
| Max 1120 | 186 | 158 | 188 |
| Min 1122 | 166 | 130 | 130.3 |
| Ave 1124 | 179.0 | 148.2 | 166.8 |

Figure 11

INTEGRATED CIRCUIT DEVICE HAVING PROGRAMMABLE INPUT CAPACITANCE

CROSS-REFERENCE TO RELATED APPLICATION

This patent application claims priority to U.S. Provisional Patent Application No. 61/619,020, filed Apr. 2, 2012, which is hereby incorporated by reference herein in its entirety.

BACKGROUND

In some memory systems, memory devices of a memory module are accessed by a memory controller using address and control lines, which are routed such that the address and control signals arrive at each of the memory devices in sequence (e.g., in a flyby topology). With different memory module rank configurations, there may be respective different control/address bus capacitive loading presented by the memory devices. For example, there may be separate control bus lines for each rank while the number of address bus lines is independent of the ranks in the memory system. Because of different loading (or lengths) of signal lines, signals propagating on those signal lines are skewed relative to one-another. The capacitance loading of command/address signal lines may vary depending on the number of memory ranks in the memory subsystem. In a system having more than one rank, the capacitance loading of the address lines may be different from the loading of the control signal lines, resulting in skew between the relative arrival times of control signals and command/address signals. Assuming that the trace impedance in the device loading area and the device pitch are the same for both address and control bus lines, systematic skew is accumulated along the bus between the control pins and the address pins as the control/address signals propagate on the fly-by bus from the first memory device to the last memory device.

BRIEF DESCRIPTION OF THE DRAWINGS

In order to facilitate a fuller understanding of the present disclosure, reference is now made to the appended drawings. These drawings should not be construed as limiting the present disclosure, but are intended to be exemplary only.

DETAILED DESCRIPTION OF EXEMPLARY EMBODIMENT(S)

Various embodiments described herein are directed to memory systems, modules, and/or components, such as integrated circuit memory devices and integrated circuit devices that control such memory devices. In various embodiments, the integrated circuit memory devices feature a programmable input capacitance (also referred to herein as "loading"). In an exemplary embodiment, a programmable register of a memory device may store a value that represents an adjustment to an input capacitance of at least one pin of the memory device (e.g., where the input capacitance of the pin is programmably adjustable). An embodiment is directed to a system where signal skew may be controlled by allowing programmability of the lighter loaded pins of the memory device in order to increase their load to match more heavily loaded pins of the memory device. By matching lighter loaded pins to more heavily loaded pins, improved matching of propagation delays between the control pins and the address pins for signals arriving at the memory device may be realized (e.g., for memory module ranks which feature different signal loading on the memory module, such as different control and address line loading).

In addition, various embodiments describe a memory controller which provides the ability to vary, program or adjust input capacitance loading of memory devices, where the loading varied, adjusted or programmed depends on how many ranks of memory devices are in the memory system. For instance, the load at a drop of a multi rank control bus can be balanced by increasing the capacitance at the control pins of each memory device in that rank. For example, a single rank system may have equal loading between the address pins and the control pins while a dual rank system may have twice the loading at the address bus drop compared to the control bus drop. In an embodiment featuring a dual rank memory system, the capacitance at the control pins of a memory device may be adjusted in order to balance the load at each drop. For example, this balancing may involve increasing the capacitance at the control pins to twice its input capacitance value. In an embodiment featuring a four rank system, the ability is provided to adjust the capacitance at the control pins of a memory device to four times the base input capacitance of each control pin. The same concept may be applied to other multi rank systems.

Figure 1:
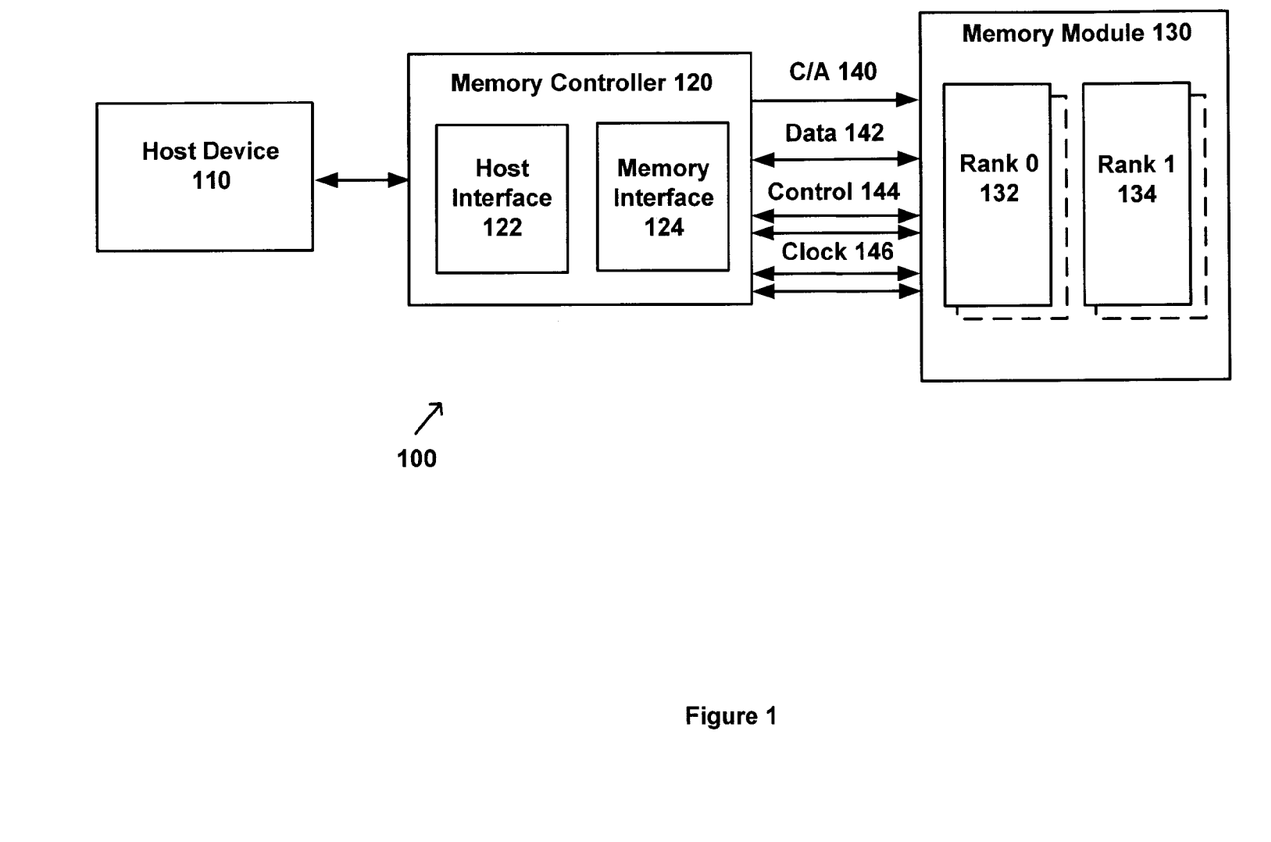
FIG. 1 illustrates an embodiment of a system having programmable capacitance loading, in accordance with an embodiment of the present disclosure.

FIG. 1 illustrates an embodiment of a system 100 including a host device 110, a memory controller 120 and a memory module 130. For example, system 100 may represent a computer system such as a desktop computer, laptop computer, tablet computer, server system, mainframe or multi-user system, a network switching apparatus, such as a router, switch, bridge, or other various consumer electronic devices, including mobile devices, communication devices, networking devices, video/image processing devices, gaming devices, etc.

Host device 110 may include one or more processors and associated non-volatile storage to store program code. In the exemplary application of FIG. 1, memory controller 120 may include a host interface 122 and a memory interface 124. While a single representative memory module 130 is shown, memory module 130 may include a plurality of memory devices (also commonly known as memory chips), such as dynamic random access memory (DRAM) devices. Host interface 122 may receive instructions from the host device 110. For example, instructions may include memory access instructions. Host interface 122 may also transfer read and/or write data to and from host device 110. Memory interface 124 may include input/output logic to manage the transfer of read and write data between host interface 122 and memory devices on memory module 130. For example, memory devices on memory module 130 receive read request information from memory controller 120, retrieve corresponding read data from a memory core of one or more memory devices in response to the read request information, and transmit data to memory controller 120. In an exemplary embodiment, host device 110 is a single integrated circuit device which includes the functionality of memory controller 120, including the memory interface 124.

In this exemplary application illustrated in FIG. 1, memory module 130 may be configured as dual ranks of memory devices, which includes Rank 0 devices 132 and Rank 1 devices 134. While two ranks are illustrated, additional ranks—as shown by the dash lines—may be implemented for other multi rank configurations. Memory module 130 may be coupled to memory controller 120 by various signal lines. For example, memory module 130 may be coupled to memory controller 120 by shared command/address (C/A) lines 140 and shared data lines 142. Command/address lines 140 may convey memory access requests from memory controller 120 to the memory devices on memory module 130. Data lines 142 may convey read and write data between memory controller 120 and memory devices on memory module 130. Mask signal lines may be provided to convey masking information, which may be used to mask the writing of selected bits or groups of bits during a write operation. The mask signals may be also be conveyed on address lines, data lines or other lines in a time multiplexed fashion.

Examples of memory modules may include dual in-line memory modules (DIMMs) and single in-line memory modules (SIMMs) that may be designed to be removably inserted into sockets or other mechanical interconnect structures and thereby coupled to segments of the request, data and clock signals lines formed, for example, as traces on a printed circuit board. According to various embodiments, the memory devices that constitute each memory rank may be disposed on separate memory modules. Also, dual or multi memory ranks may be on the same memory module where ranks of memory devices are disposed on opposite sides or can have two ranks on each side to form quad rank modules. In other embodiments, termination structures may be disposed on a printed circuit board to which the memory modules are mounted. While two memory ranks are shown, more or fewer memory ranks may be provided in alternative configurations with the appropriate additional signal lines. According to yet another exemplary scenario, the host device, memory controller and/or memory devices which form one or both of the memory ranks may be disposed on a common printed circuit board (e.g., daughterboard or motherboard), or within a single integrated circuit package (e.g., in a multi-chip package or system-in-package (SIP) arrangement), in which case the request data and clock signal lines may be formed by appropriate conductive interconnects within the package or die.

According to various embodiments, some signals may be dedicated to particular ranks, such as control signals 144 which may include chip select (CS), on-die termination (ODT) control signals and clock enable (CKE), for example. Chip select signals enable memory devices of a rank for a particular memory access. In other words, these signals select one or more memory devices (e.g., as is defined to be included in a particular selected rank) for a memory access. ODT signals may enable on-die terminators for data signals received at the memory devices of a rank. For example, ODT control signals may indicate to a given rank of memory devices that it should terminate the bus.

Timing signals, such as clock signals (e.g., clock 146) and/or strobe signals, are used to time the transmitting/sampling of control information, command information and/or data at the applicable interfaces of the memory controller 120 and memory devices on memory module 130. Such timing signals may be conveyed by clock lines 146. Clock-enable signals may convey enablement of clock signals and other power management information to memory devices, e.g., in a selected rank. It should be noted that the above signals, while described in the context of a particular rank organization of memory devices, also apply individually to a single memory device.

Memory module 130 may include a non-volatile storage, usually a serial presence detect (SPD) electrically erasable/programmable read only memory (EEPROM) that contains information about the memory module. The information may include how many memory devices are on the module, the density of those devices, etc. Thus, during an initial booting process or operation, the memory controller 120 or host device 110 may directly or indirectly read a SPD EEPROM or other non-volatile storage, e.g., a non-volatile memory used to store basic input-output service (BIOS) program code and/or other boot-time program code, during system startup, to determine the memory system topology, configuration and/or operational parameters. For example, memory controller 120 may determine the organization of one or more memory modules. Specifically, the information may include which modules are present and the rank configuration for each of those modules. Based on this information, memory controller 120 may then program one or more registers on memory devices on the memory module accordingly. For example, memory controller 120 may determine that the memory module 130 is a four rank system. Based on this information, memory controller 120 may then program the registers and adjust the loading to about 4 times (e.g., 3.8×) for the control pins on the memory device(s). In this example, a memory controller or other circuit may generate a value that specifies an adjustment to an input capacitance of a control pin. An interface, such as memory interface 124, may then provide a control signal to the control pin of the memory device.

When a system is turned on, the system's initial process includes automatically configuring the hardware currently present. The SPD may be used to determine memory attributes corresponding to memory devices present in the system, for example such attributes may indicate what timings the memory controller will use to access the memory devices. Also, in most cases, there is a procedure for accessing BIOS parameters to view and potentially make changes in settings. Thus, it may be possible to control how the computer uses the memory SPD data. SPD data may also include timing parameters and other key parameters of the module. For example, the BIOS may read the SPD information to configure the memory controller.

Figure 2:
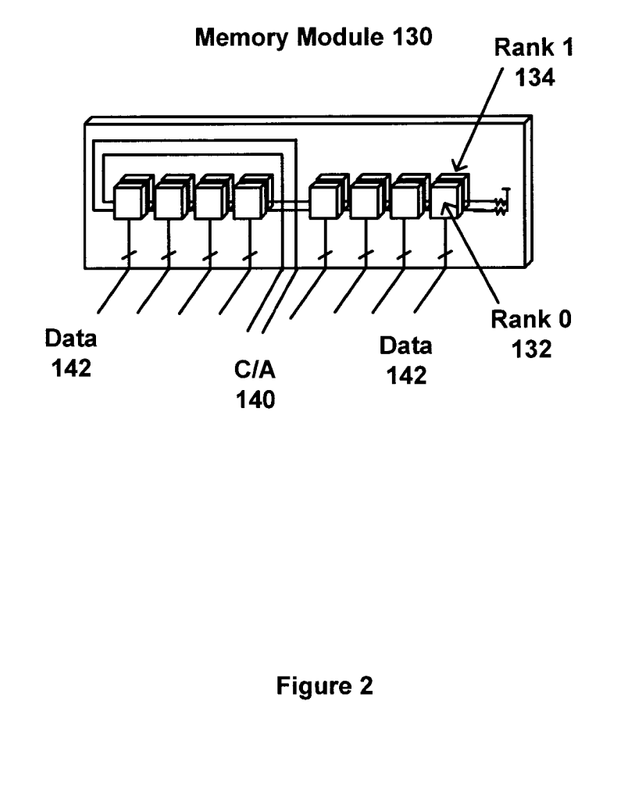
FIG. 2 is an exemplary illustration of a memory module, in accordance with an embodiment of the present disclosure.

FIG. 2 is an exemplary illustration of a memory module, in accordance with an embodiment of the present disclosure. In this exemplary illustration, memory module 130 includes two ranks of memory devices. In this embodiment Rank 0 includes a first set of eight memory devices, 132 and Rank 1 includes a second set of eight memory devices, 134. As discussed above, a rank may represent a group of memory devices that may be accessed for a single transaction. For example, a single read or as single write may access a group of eight devices at one time, for example, via a chip select signal.

Memory module 130 illustrates an exemplary two rank configuration (Rank 0 and Rank 1). In this exemplary illustration, a first set of devices may be positioned on a front side of a substrate (e.g., printed circuit board) of the module and a second set of devices may be positioned on the other side of the substrate (e.g., using a clamshell configuration). Other configurations may be implemented where a group of devices may be defined in a different manner. Moreover, additional ranks of devices may also be added to the memory module. For example, for a four rank configuration, a third set of devices may be positioned on top of the first set of devices and a fourth set of devices may be positioned on top of the second set of devices (e.g., using a stacked approach such as stacking the memory devices in discrete packages or having memory device dies stacked together in a single package using wire bonds connections or through silicon vias (TSVs)). According to another example configuration, the additional ranks of devices may be positioned next to a set of devices.

In this exemplary illustration, each data line 142 is shared between two sets of memory devices. For example, data line 142 may be used in the transfer of data with both a first memory device associated with Rank 0 and a second memory device associated with Rank 1.

In this exemplary illustration, a fly by topology is shown for C/A line 140. As shown, the devices are accessed using command/address signals which propagate on a single command/address path and arrive at each memory device in sequence. Other topologies and variations for routing signals may be used. For example, a hybrid T topology may be implemented where signals may be split again and again until terminating at respective memory devices. Other variations of the fly by and T topologies may be implemented.

Figure 3:
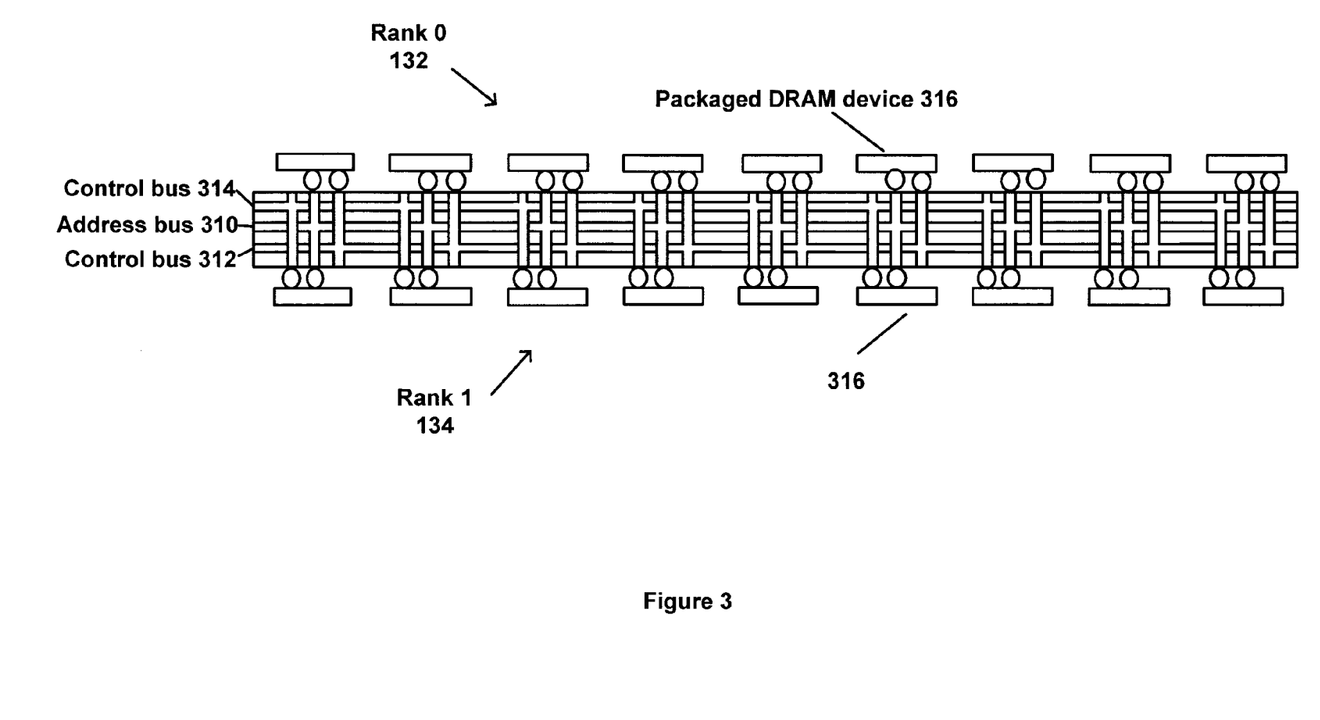
FIG. 3 is an illustration of a dual rank module, in accordance with an embodiment of the present disclosure.

FIG. 3 is an illustration of a dual rank module, in accordance with an embodiment of the present disclosure. Two devices, such as DRAM devices 316 are shown on a single printed circuit board that serves as a substrate for the module. Rank 0, illustrated as 132, is shown on top of the board and Rank 1, illustrated as 134, is shown below the board. In this illustration, each memory rank may include eight memory devices. The memory devices for Rank 0 are coupled in common to a control signal line (Control bus 312), memory devices of Rank 1 are coupled in common to another control signal line (Control bus 314) and memory devices of both ranks are coupled in common to a C/A signal line (Address bus 310). More specifically, a single address bus 310 may be used to access both Rank 0 and Rank 1 devices. Control bus 312 is dedicated to Rank 0 devices and control bus 314 is dedicated to Rank 1 devices. Thus, each individual signal line of the control signal lines is coupled to eight capacitance loads and each individual signal line of the command/address signal lines is coupled to sixteen capacitive loads, eight from each rank. Because a single address bus 310 provides access to both sets of devices, Rank 0 and Rank 1, address bus 310 has two times the capacitance loading (2×) of each control bus.

The same concept may be applied to a four rank (or quad rank) module where a single address bus may have four times the capacitance loading (4×) of each control bus. In a similar manner, this concept may be applied to other multi rank systems. Because a single rank device includes a single address bus and a single control bus, the loading is the same for the address bus and the control bus because only one set of devices is accessed by each of the address bus and control bus.

One way to correct for the systematic skew accumulation between the address and the control pins along the memory bus of a multi rank memory system is to make the capacitive loading programmable on the control pins of a memory device. The loading on the address pins may remain unchanged. In a single rank system, no additional capacitive loading is brought on to the control pins. However, in a dual-rank system, an additional capacitive loading is brought on to the control pins so that the total device capacitive loading is roughly twice that of the single rank's capacitive loading. By adjusting the loading on the control pins, the skew between the control pins and the address pins of a dual rank memory system may be greatly minimized. Command/Address bus and control bus routing may be kept uniform. This concept may be extended to four rank systems and other multi rank systems. Referring to the exemplary embodiment illustrated in FIG. 3, the input capacitance at the control pins of control bus 312 and the input capacitance at the control pins of control bus 314 may be adjusted to twice the base input capacitance of each control pin. By increasing the input capacitance at the control pins of a dual rank system, the loading between the address pins and control pins is balanced.

Figure 4:
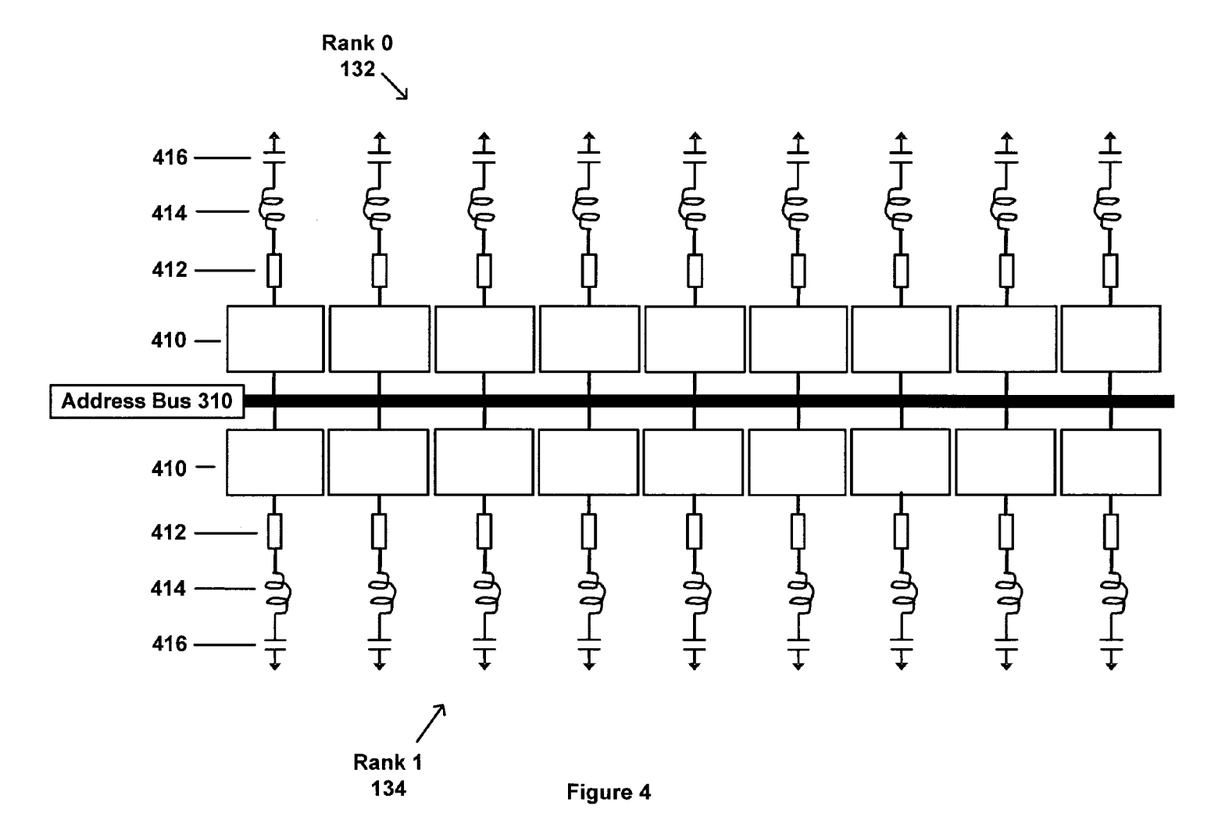
FIG. 4 is a model of address pins, in accordance with an embodiment of the present disclosure.
Figure 5:
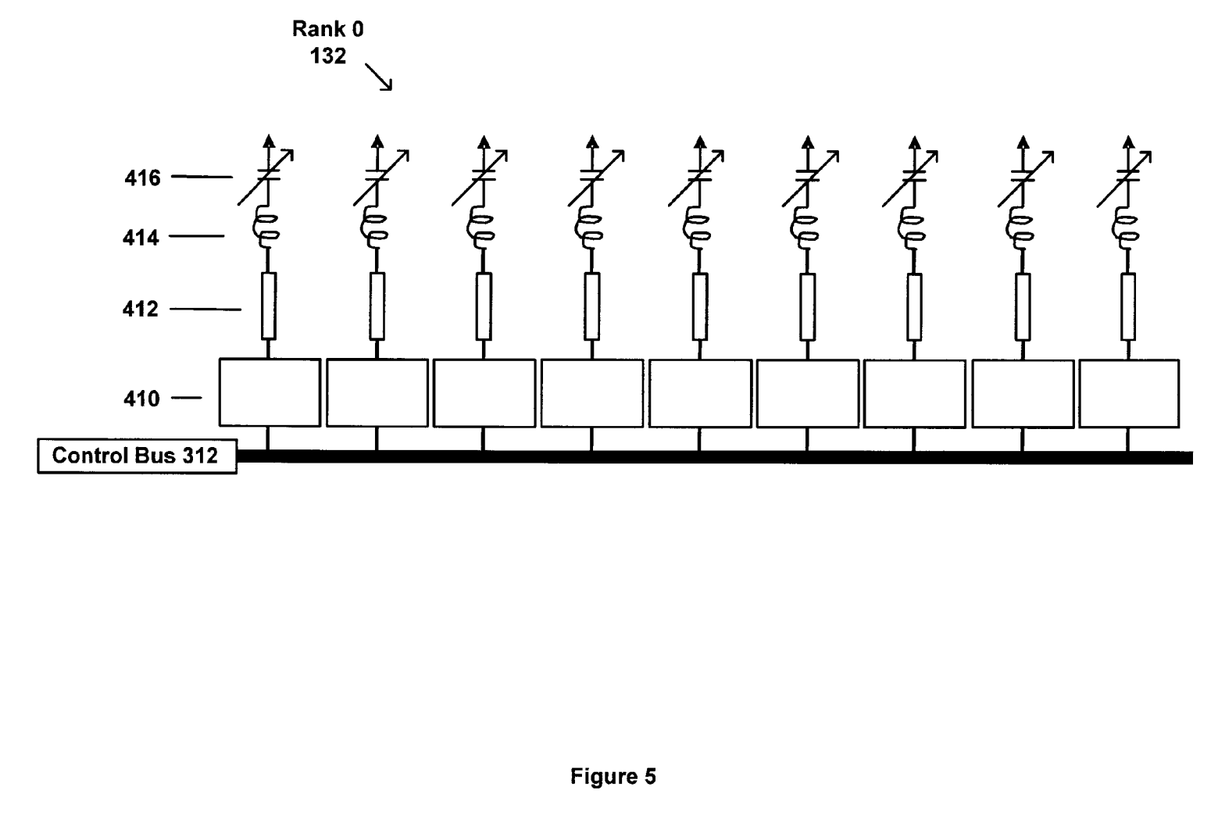
FIG. 5 is a model of control pins with programmable loading, in accordance with an embodiment of the present disclosure.

FIG. 4 is a model of a plurality of devices configured as two ranks, coupled to an address bus, in accordance with an embodiment of the present disclosure. In this dual rank example, address bus 310 may provide access to a set of devices selected from both ranks Rank 0 and Rank 1. In this example, 410 represents model for module via, microstrip stub and package ball. Also, 412 represents a package trace and 414 represents wirebond or bump inductance. The DRAM device capacitance loading represented by 416 of the address pins is not adjusted. FIG. 5 is a model of a plurality of devices coupled having control pins with programmable input capacitance, in accordance with an embodiment of the present disclosure. Control bus 312 provides access to a single rank (Rank 0) of devices, where the capacitance of the control pins may be programmable. For example, the input capacitance (or loading) represented by 416, of each device may be programmed based on the number of ranks of the system. In a dual rank system, control signal line drops may have a base (1×) loading and address signal line drops may have two times (2×) the base loading. By increasing the loading of more lightly loaded pins, the relative skew difference between address and control signals in the dual rank system may be reduced. In this example, the electrical pitch of the address and control signal lines and loaded area trace impedance of the control and the address pins may be kept substantially the same. According to another exemplary application, the loading of the pins may be adjusted down. For example, there may be a scenario where an optimal amount of capacitance and load for a system is greater than what a circuit designer could design to. In this case, it may be advantageous to start with a heavier load and as more devices are added, the load per device may be decreased.

Figure 6:
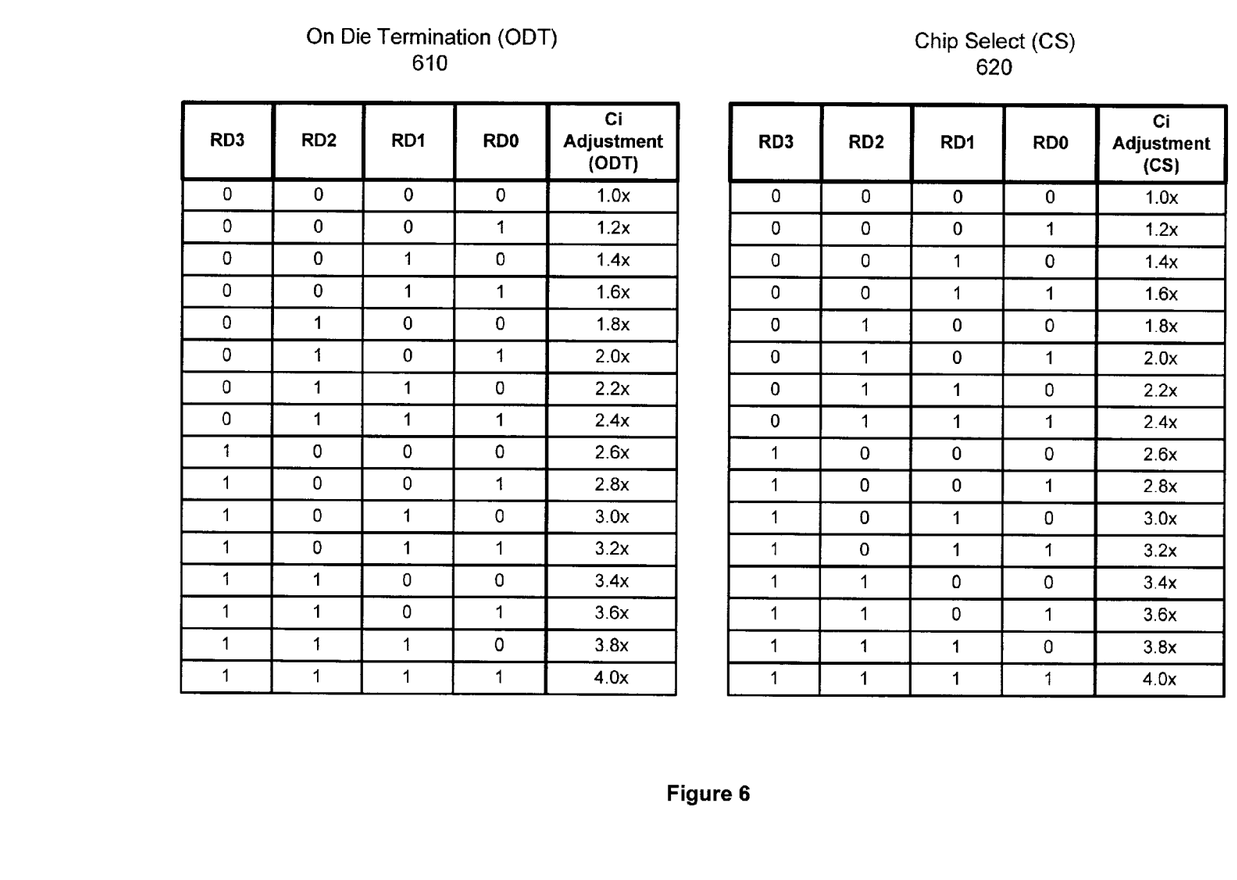
FIG. 6 is an exemplary datasheet of a load register, in accordance with an embodiment of the present disclosure.

FIG. 6 is an exemplary set of a register fields used to program input capacitance in an integrated circuit memory device, in accordance with an embodiment of the present disclosure. For a high speed memory device, FIG. 6 illustrates a register fields for programmability of different pins (for proper matching or calibration of the input capacitance, for example). It should be recognized that input capacitance for other inputs or pins may be applied. The capacitance adjustment, represented by Ci, is illustrated for ODT, at 610 and chip select, CS, at 620. As shown, programmability for different pins may be adjusted from 1.0× to 4.0× in 20% increments. For example, 1.0× may be applied to control pins of a single rank system, 2.0× may be applied to control pins of a dual rank system and 4.0× may be applied to control pins of a four rank system. The intermediate amounts, in this example are 20% increments, and provide the ability to better match or calibrate the loads for a particular system. While FIG. 6 shows adjustable loads for two registers, ODT and chip select, similar settings may be applied to clock enable and other rank specific signals. For example, alert pins for an error or a halt at an error may be rank specific.

For signals that are bound to service a specific rank, the system may use four bits of programmability, as represented by RD3, RD2, RD1 and RD0, for each of the control pins. As shown in FIG. 6, ODT pins may have one control setting and CS pins may have another setting. Also, clock enable pins may have yet another setting.

A memory device may have multiple settings, with different settings of programmability for different pins. For example, in threaded memory devices, each thread may have its own control pins (e.g., CS, CKE, ODT). Threaded memory module technology partitions memory modules into multiple independent channels that share a common command/address port. In this exemplary application, certain pins may be grouped together and programmed with one load amount. For example, chip selects for certain pins may be separately programmable and the load for those pins may be increased or otherwise adjusted. Therefore, depending on how memory devices are used in a system, separate capacitance values may be programmed for groups of pins. Also, the memory device may have the same setting for all control pins, rather than grouping separate pins together. For example, a single register may specify the load (or a relative adjustment to the load) for all control pins, a subset of control pins or even individual control pins. It should be understood, that the term "pin" as referred to in this disclosure generally refers to a conductive signal input for an integrated circuit device (commonly referred to as a chip), is not limited to a specific integrated circuit "pin" and may include structures such as solder balls and bond pads.

Figure 7:
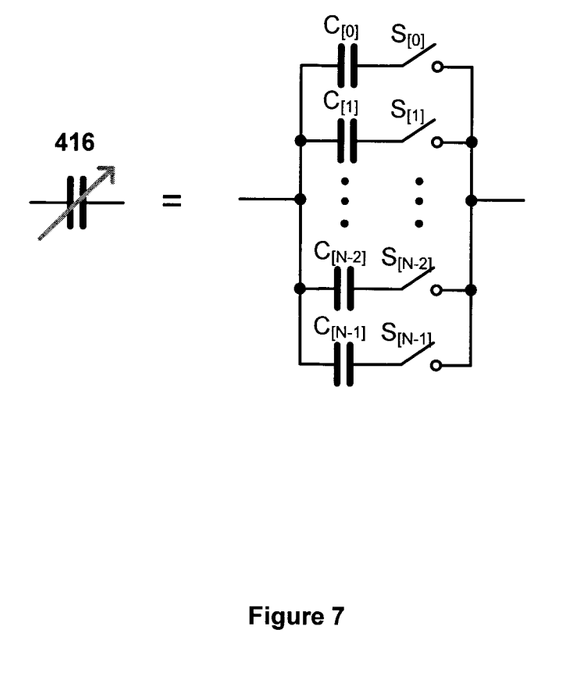
FIG. 7 is an exemplary illustration of a circuit for adjusting the load on a pin, in accordance with an embodiment of the present disclosure.

FIG. 7 is an exemplary illustration of a circuit for adjusting the load on a pin, in accordance with an embodiment of the present disclosure. Registers may store a control value for load capacitors, as represented by 416, of the memory device. As an example, a plurality of registers may be present, each of which may store a single bit to be used in controlling the load capacitors. In an exemplary illustration, registers each may be a storage circuit such as a D-type flip flop, although the scope of the present disclosure is not so limited. As shown, the loading may be adjusted by a series of switches, in this exemplary diagram, there are four switches for linear coding, binary coding, thermometer coding as well as any coding that changes the value of the capacitance. For example, each switch may be switched on or off. In this example, a series of four switches may control the loading on a pin, where 16 combinations are available. The 16 combinations may correspond to the 16 variations of adjustment shown in FIG. 6. Thus, the four capacitors shown in FIG. 7 may be of varying size and may further correspond to the four bits, RD3, RD2, RD1 and RD0, shown in FIG. 6.

An exemplary equation for linear coding may be represented by:

$$C_{[0]} = C_{[1]} = \ldots = C_{[N-2]} = C_{[N-1]} = C_{max}/N$$

$$C = S_{[0]}C_{[0]} + S_{[1]}C_{[1]} + \ldots + S_{[N-2]}C_{[N-2]} + S_{[N-1]}C_{[N-1]}$$

An exemplary equation for binary coding may be represented by:

$$2^N * C_{[0]} = 2^{N-1} * C_{[1]} = \ldots = 2*C_{[N-2]} = C_{[N-1]} = C_{max}/(2^{N+1})$$

$$C = S_{[0]}C_{[0]} + S_{[1]}C_{[1]} + \ldots + S_{[N-2]}C_{[N-2]} + S_{[N-1]}C_{[N-1]}$$

In the above equations, C represents a capacitance value and S represents a switch. Other representations of programmable loading may also be implemented in accordance with the present disclosure.

Figure 8:
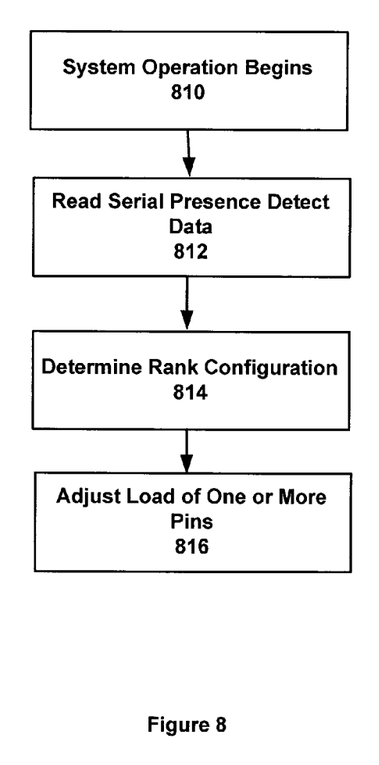
FIG. 8 illustrates an exemplary technique for programming capacitance loading based on rank configuration, in accordance with an embodiment of the present disclosure.

FIG. 8 illustrates an exemplary technique for programming capacitance loading based on rank configuration, in accordance with an embodiment of the present disclosure. At block 810, a system operation may be initiated. At block 812, during system operation, a device such as host device (or memory controller) may read a SPD non-volatile storage to determine the memory system topology and/or operational parameters. At block 814, based on the SPD information, a memory controller may determine rank configuration of the memory module. Rank configuration may include single rank, dual-rank, quad-rank and other rank configurations and variations thereof. As discussed above, for a single rank system, the pins may not have any adjustment because any skew is negligible. However, for multi rank configurations, (because skew may be an issue because of the uneven loading of the control pins and address pins) an adjustment of a set of pins may be implemented. At block 816, based on the rank configuration, one or more pins may be adjusted. For example, a memory controller or circuit may specify an adjustment to an input capacitance of the control pins. An interface, such as memory interface, may then transmit a signal to the control pins of the memory device to make the input capacitance adjustment. The adjustment may be to increase the loading of a set of control pins. Also, the adjustment may be to decrease the loading of a set of pins to even out skew.

Figure 9:
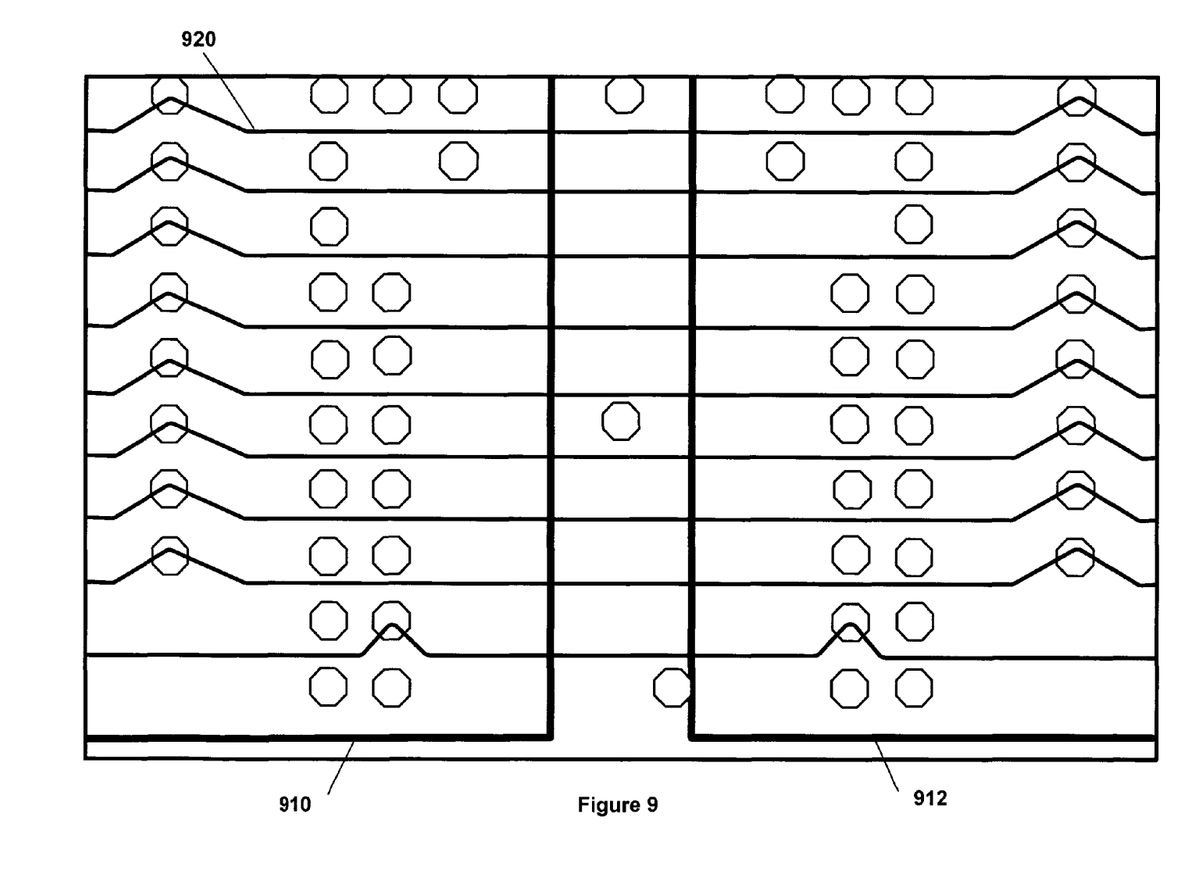
FIGS. 9 and 10 illustrate another embodiment to minimize skew in a multi rank memory system, in accordance with an embodiment of the present disclosure.
Figure 10:
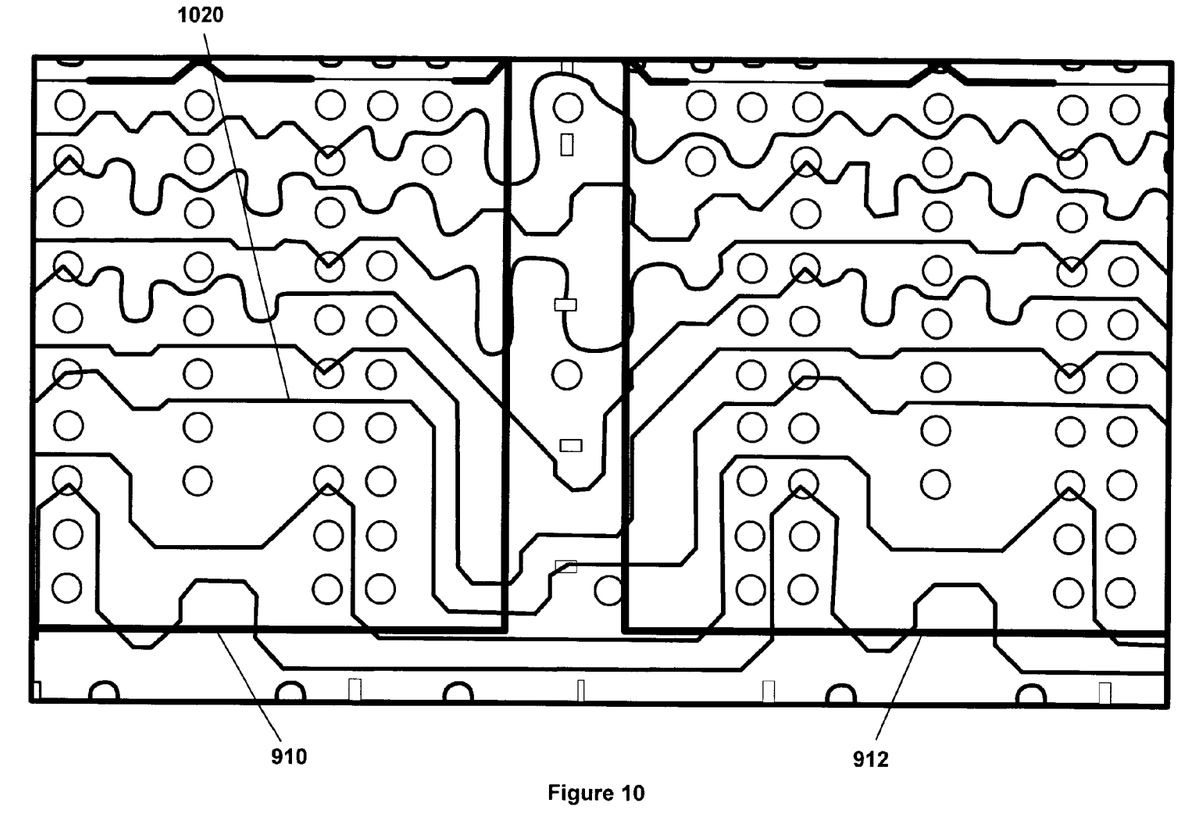

FIGS. 9 and 10 illustrate another embodiment to minimize skew in a multi rank memory system, in accordance with an embodiment of the present disclosure. Electrical pitch and/or loaded area trace impedance of the control signals may be adjusted based on the number of ranks in the memory system. FIG. 9 illustrates an address bus between two memory modules, such as two DRAM devices, represented by 910 and 912. As shown in FIG. 9, the routing between the two memory modules is substantially straight. An exemplary routing is shown by trace line 920. FIG. 10 illustrates a control bus with longer trace lengths to add more delay to compensate for the capacitance loading. In other words, by adding delay with longer trace lengths, the delay compensates for or offsets the capacitance loading. An exemplary delayed routing is shown by trace line 1020. Thus, for a dual rank system, a longer trace may cause a delay to compensate for the 2× load on the address bus.

An exemplary equation for the loaded delay embodiment may be represented by:

$$T_{pd} = [L_1 * C_{T1}]^{1/2} = [L_2 * C_{T2}]^{1/2}$$

where $C_{T1} = (C_1 + C_{d1}/P1)$ and $C_{T2} = (C_2 + C_{d2}/P2)$ where $L_1$ corresponds to the inductance/length, $C_1$ corresponds to capacitance/length, $C_{d1}$ corresponds to capacitive device loading and $P_1$ corresponds to electrical (trace) pitch of the address bus, and similarly, $L_2$, $C_2$, $C_{d2}$ and $P_2$ corresponds to that of the control bus. Here, the contribution of the module via, package BGA ball and trace are assumed to be small to the loaded propagation delay.

Figure 11:
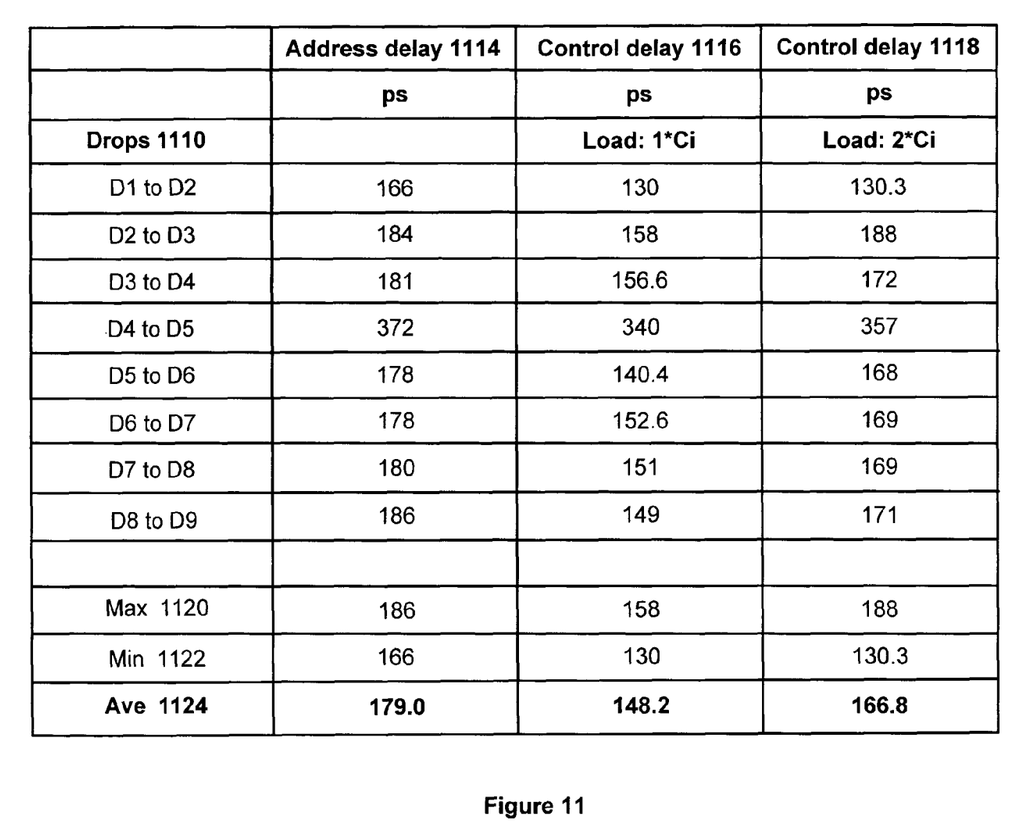
FIG. 11 illustrates the delays assigned to address pins and control pins, in accordance with an embodiment of the present disclosure.

FIG. 11 illustrates delay information pertaining to address pins and control pins, in accordance with an embodiment of the present disclosure. In various embodiments, such delay information may be stored in a memory module SPD (e.g., as described above) and used by the system (e.g., the memory controller) to determine what capacitive loading adjustment is programmed for a respective memory device of the memory module. Drops 1110 represent a signal path between memory device pins, denoted by D1 to D9, disposed on the memory module. Address delay 1114 represents the delay between each consecutive pin. Control delay 1116 represents the delay between each consecutive pin where the load is unchanged. Control delay 1118 represents the delay between each consecutive pin where the load is compensated and increased to twice the load. For a dual rank system, the system may match control pins with an appropriate delay to effectuate a 2× load, as shown by 2*Ci. Max 1120 row represents the maximum delay for address delay, control delay and control delay with twice the load. Min 1122 row represents the minimum delay for clock delay, address delay, control delay and control delay with twice the load. And, finally Ave 1124 row represents an average delay for each type of delay. It is noted that the delay between drops D4 to D5 is not counted in the average as the distance between these drops deviates significantly from the electrical pitch due to much larger separation between them as shown in FIG. 2.

The present disclosure is not to be limited in scope by the specific embodiments described herein. Indeed, various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. An integrated circuit device comprising:
a pin to receive an external signal and to present an input capacitance to an external signal line carrying the external signal;
a programmable register to store a value that represents an adjustment to the input capacitance presented by the pin to the external signal line; and,
an interface to receive the value, wherein the value that represents the adjustment is to be based at least in part on a signal routing topology of the external signal line.

2. The integrated circuit device of claim 1, wherein the external signal is a control signal carried by the external signal line to at least one additional integrated circuit device.

3. The integrated circuit device of claim 1, wherein the value that represents the adjustment is further based at least in part on a rank configuration associated with the integrated circuit device.

4. The integrated circuit device of claim 3, wherein the adjustment is an increase in capacitance loading.

5. The integrated circuit device of claim 1, wherein the integrated circuit device is a dynamic random access memory (DRAM) device.

6. A memory device, comprising:
a first pin having a first load to be presented to a first external signal line that is substantially fixed;
a second pin having a second load, to be presented to a second external signal line, that is programmably adjustable; and,
an interface to receive a value to programmably adjust the second load, wherein the value is to be based at least in part on a signal routing topology of the external signal line.

7. The memory device of claim 6, wherein the second pin is configured to receive a control signal.

8. The memory device of claim 6, wherein the second load is based at least in part on a rank configuration associated with the memory device.

9. The memory device of claim 6, wherein the second load is programmably increased.

10. The memory device of claim 6, wherein the first pin is configured to receive an address signal.

11. An integrated circuit device comprising:
a circuit to generate a value that specifies an adjustment to an input capacitance presented by a pin of a memory device to an external signal line, the value based at least in part on a signal routing topology of the external signal line;
a first interface to provide, to the memory device, the value that specifies the adjustment to the input capacitance presented by the pin of the memory device to the external signal line; and,
a second interface to provide a control signal to the pin of the memory device.

12. The integrated circuit device of claim 11, wherein the value that specifies an adjustment is based at least in part on a rank configuration associated with the memory device.

13. The integrated circuit device of claim 11, wherein the adjustment is an increase in capacitance loading.

14. The integrated circuit device of claim 11, wherein the integrated circuit device is disposed on a printed circuit board.

15. A memory controller, comprising:
an interface to program a register on a memory device, wherein the register stores a value representative of an input capacitance value presented by a pin on the memory device to an external signal line; and,
a circuit to determine a rank configuration associated with the memory device, wherein the value is based at least in part on the rank configuration associated with the memory device.

16. The memory controller of claim 15, wherein the circuit to determine the rank configuration associated with the memory device is to receive an indicator of the rank configuration associated with the memory device from non-volatile storage.

17. The memory controller of claim 15, wherein the pin is configured to receive a control signal.

18. A method of operation of an integrated circuit device that controls the operation of a memory device, the method comprising:
determining a rank configuration associated with the memory device;
based at least in part on the rank configuration, programming a load presented by a pin of the memory device to an external signal line.

19. The method of claim 18, wherein the pin is configured to receive a control signal.

20. A method, comprising:
determining a rank configuration associated with a memory device;
based at least in part on the rank configuration:
programming a first load to be presented to a first external signal line by a first pin of the memory device; and programming a second load to be presented to a second external signal line by a second pin of the memory device, wherein the first load is different from the second load.

21. The method of claim 20, wherein the first pin is configured to receive a first control signal and the second pin is configured to receive a second control signal.

22. The method of claim 20, wherein the first load and the second load are based at least in part on the rank configuration associated with the memory device.

23. An method of operation of a memory device, the method comprising:
 determining, based at least in part of a signal routing topology of an external signal line connected to a pin of the memory device, a value representative of an adjustment to an input capacitance value presented by the pin to the external signal line;
 transmitting, to the memory device, the value representative of the adjustment to the input capacitance value presented by the pin to the external signal line; and
 storing the value in a register of the memory device.

24. The method of claim 23, wherein the pin receives a control signal.

25. The method of claim 23, wherein the value representative of the adjustment is further based at least in part on a rank configuration associated with the memory device.

26. The method of claim 23, wherein the adjustment is an increase in capacitance loading.

\* \* \* \* \*